United States Patent [19]
Taniguchi et al.

[11] Patent Number: 5,735,203
[45] Date of Patent: Apr. 7, 1998

US005735203A

[54] APPARATUS FOR PRINTING SOLDER PASTE TO A PRINTED CIRCUIT BOARD AND SEPARATING A SCREEN MASK PLATE FROM THE PRINTED CIRCUIT BOARD

[75] Inventors: Masahiro Taniguchi, Hirakata; Toshinori Mimura, Katano; Kazue Okanoue, Kadoma; Hiroaki Onishi, Higashiosaka; Nobuya Matsumura, Kyoto, all of Japan

[73] Assignee: Matsushita Electric Industrial Co., Ltd., Osaka-fu, Japan

[21] Appl. No.: 762,872

[22] Filed: Dec. 12, 1996

Related U.S. Application Data

[62] Division of Ser. No. 631,021, Apr. 12, 1996.

[30] Foreign Application Priority Data

Apr. 12, 1995 [JP] Japan ................ 7-86595

[51] Int. Cl.⁶ .................................... B41F 15/26
[52] U.S. Cl. .............................. 101/126; 101/129
[58] Field of Search .................... 101/114, 126, 101/129; 118/210, 213; 427/96; 437/182, 183, 203

[56] References Cited

U.S. PATENT DOCUMENTS

| | | | |
|---|---|---|---|
| 4,902,371 | 2/1990 | Andris et al. | 101/129 |
| 5,174,201 | 12/1992 | Andris et al. | 101/129 |

FOREIGN PATENT DOCUMENTS

| | | |
|---|---|---|
| 236489 | 8/1992 | Japan. |
| 236490 | 8/1992 | Japan. |
| 236491 | 8/1992 | Japan. |
| 5-111994 | 5/1993 | Japan. |
| 5-286113 | 11/1993 | Japan. |
| 214748 | 8/1995 | Japan. |

*Primary Examiner*—Stephen R. Funk
*Attorney, Agent, or Firm*—Wenderoth, Lind & Ponack

[57] ABSTRACT

An apparatus for printing a solder paste to a printed circuit board with use of a screen mask plate and a squeegee. The apparatus includes a device for moving one of the printed circuit board and the screen mask plate at a first moving speed in a direction to be separated from the other of them after printing of the solder paste and until the moving one of the printed circuit board and the screen mask plate reaches a plate-separation position which is a position immediately before the screen mask plate and the printed circuit board are completely separated from each other, and a controller for changing the first moving speed to a second moving speed higher than the first moving speed when the moving one of the printed circuit board and the screen mask plate reaches the plate-separation position.

12 Claims, 9 Drawing Sheets

APPARATUS FOR PRINTING SOLDER PASTE TO A PRINTED CIRCUIT BOARD AND SEPARATING A SCREEN MASK PLATE FROM THE PRINTED CIRCUIT BOARD

This is a divisional application of Ser. No. 08/631,021, filed Apr. 12, 1996.

BACKGROUND OF THE INVENTION

The present invention relates to a method and an apparatus for printing/applying a solder paste to printed circuit boards.

Recently, in technology for mounting electronic components to printed circuit boards, because an electrode part of the electronic component has become increasingly fine, it is required to correctly apply a predetermined amount of solder paste to a minute land formed on the printed circuit board for the electrode part. In other words, a high accuracy is demanded in printing the solder paste.

Figure 7A:
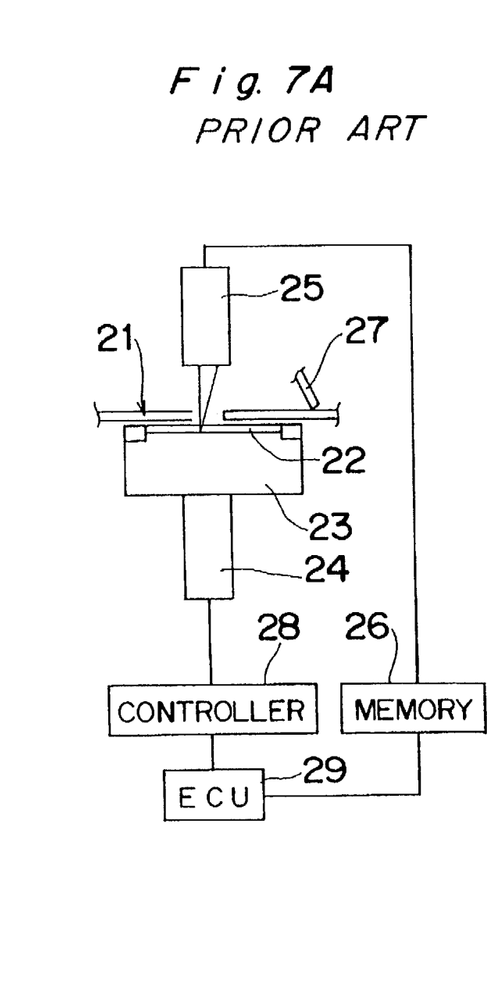
FIG. 7A is a schematic structural diagram of a conventional solder paste printing method.
Figure 7B:
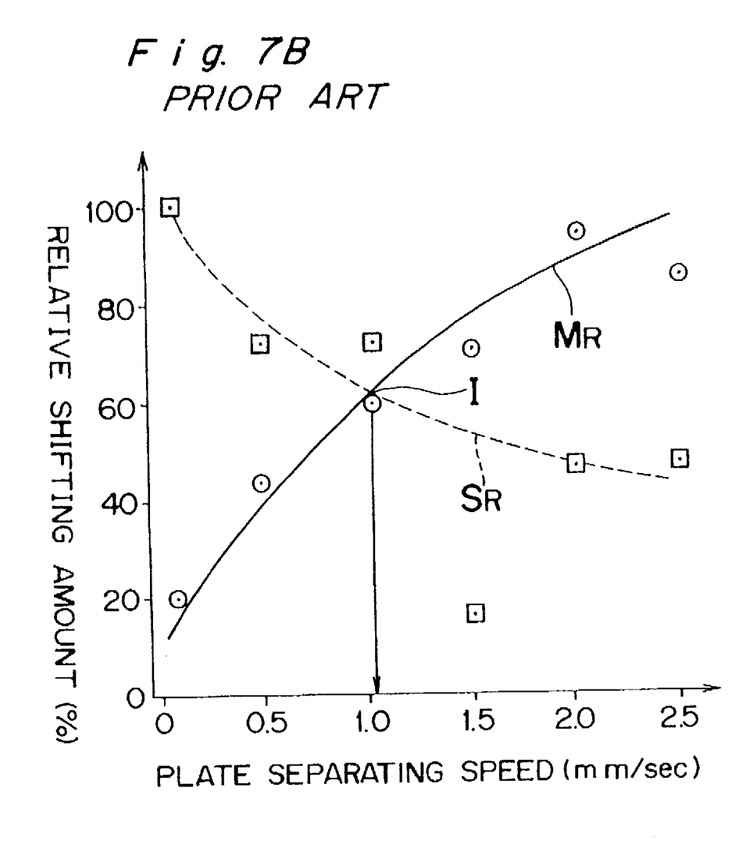
FIG. 7B is a diagram of a correlation between a relative shifting amount of a printing mask and a relative shifting amount of the solder paste.

A conventional solder-printing method will be described below. For example, Japanese Laid-Open Patent Publication No. 5-111994 (111994/1993) discloses a printing method to obtain a good printing result while preventing the deterioration in shape or tear-off of the solder paste. More specifically, as shown in FIG. 7A, in a plate-separation process of the disclosed method, a printed circuit board 22 on a stage 23 is lowered by a lift means 24 to separate the printed circuit board 22 from a printing mask 21 after the solder paste is printed to the printed circuit board 22 held in tight contact with the mask 21. During this time, a deflection amount M of the printing mask 21 and a spreading amount S of the solder paste printed on the printed circuit board 22 are measured by a distance sensor 25 and recorded in a memory 26, and maximum values of the amounts M and S when the plate is separated from the circuit board are obtained while a separating speed is changed. Then, relative shifting amounts $M_R$ and $S_R$ to the maximum values of the deflection amount M of the printing mask 21 and the spreading amount S of the solder paste as references are detected for each separating speed, as shown in FIG. 7B, to thereby set the separating speed to be a speed at an intersection I of the relative shifting amounts. The solder paste is thus prevented from being degraded in shape or torn off to get a good printing result. In FIG. 7, 27 is a squeegee, 28 is a controller for the lift means 24, and 29 is an electronic control unit (ECU).

Figure 8:
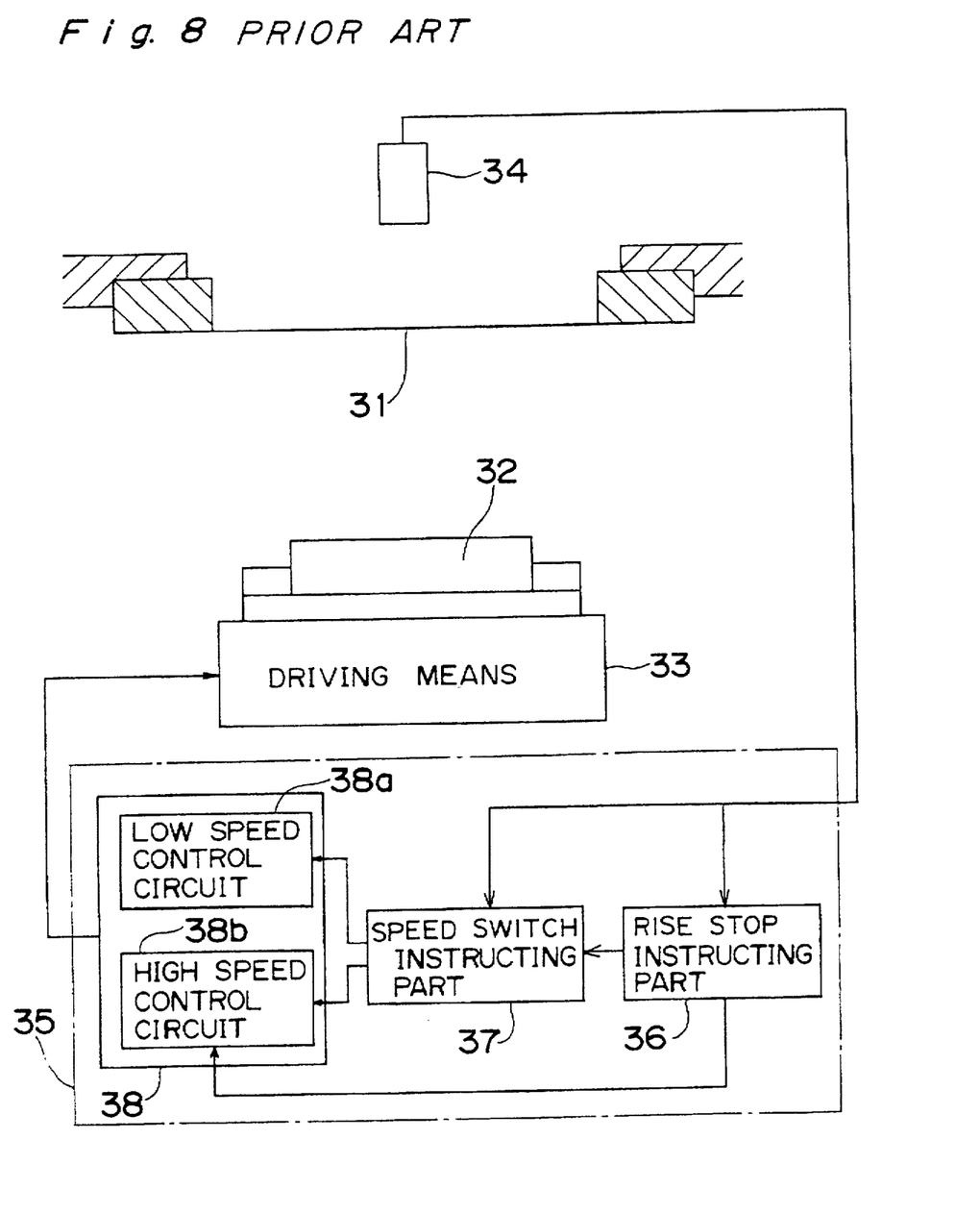
FIG. 8 is a schematic structural diagram of another conventional solder paste printing method.

Another prior art method, Japanese Laid-Open Patent Publication No. 5-286113 (286113/1993), relates to switching of a lowering speed of a circuit board. As shown in FIG. 8, in a plate-separation process after a solder paste is printed to a circuit board 32 held in contact with a printing mask 31, a downward deflection shift of the printing mask 31 following the downward movement of the circuit board 32 by a driving means 33 is detected by a distance sensor 34. It is so decided that the plate (mask 31) is completely separated from the circuit board 32 when the downward deflection shift of the printing mask 31 is changed to an upward deflection shift, and the lowering speed of the circuit board 32 is switched from low to high. In FIG. 8, reference numeral 35 is a control means for controlling the driving means 33 based on a detection signal from the distance sensor 34, having a rise stop instructing part 36, a speed switch instructing part 37, and a drive control part 38 which are built therein. The drive control part 38 equipped with a low speed control circuit 38a and a high speed control circuit 38b moves up the circuit board 32 to a printing position at a high speed by the driving means 33, starts to lower the circuit board 32 at a low speed after printing and drops the circuit board 32 at a high speed when the separation of the plate is completed.

In the method proposed in Japanese Laid-Open Patent Publication No. 5-111994, however, the separating speed is fixedly determined at a speed in the vicinity of the intersection of the relative shifting amounts of the printing mask 21 and the solder paste, with the result that a good printing result is not always achieved.

Meanwhile, according to the method revealed in the published specification of No. 5-286113, it is decided that the printing mask 31 is completely separated from a printing mask 31 when the downward deflection shift and deformation of the printing mask 31 subsequent to the fall of the circuit board 32 after printing is changed to the upward deflection shift, and then an instruction to lower the circuit board 32 at a high speed from a low speed is ordered. Although the method eliminates a waste of time, it does not work as a solution to produce a good printing state, because the solder paste has already been transferred to the circuit board 32 when the lowering speed is changed after the completion of the separation of the printing mask 31.

In other words, in order to form a good printing state, it is important to control conditions for the separation of the printing mask. If an inadequate condition is set, the solder paste goes beyond a predetermined printing area and spreads where fine printed parts are concentrated or a bridge is generated (that is, adjacent printed parts are erroneously connected to each other), which may cause clogging of an opening of the printing mask. As a consequence, the solder paste cannot be sufficiently supplied, deteriorating the soldering quality.

SUMMARY OF THE INVENTION

An object of the present invention is to provide a method and an apparatus for obtaining a good printing state of a solder paste by setting a proper condition for the separation of a printing mask.

In accomplishing these and other aspects, according to a first aspect of the present invention, there is provided a method for printing a solder paste to a printed circuit board with the use of a screen mask plate and a squeegee, the method comprising steps of:

moving one of the printed circuit board and the screen mask plate at a first moving speed in a direction to be separated from the other of them after printing of the solder paste and until the moving one of the printed circuit board and the screen mask plate reaches a plate-separation position which is a position immediately before the screen mask plate and the printed circuit board are completely separated from each other; and changing the first moving speed to a second moving speed higher than the first moving speed when the moving one of the printed circuit board and the screen mask plate reaches the plate-separation position.

According to a second aspect of the present invention, there is provided the solder paste printing method according to the first aspect, wherein in the changing step, the first moving speed is changed to the second moving speed at the plate-separation position so that a brittle fracture is impressed to the solder paste present between the printed circuit board and the screen mask plate.

According to a third aspect of the present invention, there is provided the solder paste printing method according to the first aspect, wherein in the changing step, the second moving speed is a hundredfold faster than the first moving speed or more.

According to a fourth aspect of the present invention, there is provided the solder paste printing method according to the first aspect, wherein the changing step includes steps of:

detecting a vibration waveform of a mask of the screen mask plate generated after the screen mask plate and the printed circuit board are separated from each other; and thereby setting the plate-separation position so that a maximum amplitude of the waveform based on a position of a free surface of the mask of the screen mask plate and a vibration time of the waveform until the mask settles in the position of the free surface after the maximum amplitude are minimum.

According to a fifth aspect of the present invention, there is provided the solder paste printing method according to the first aspect, wherein the changing step includes steps of:

measuring a sectional shape of a film of the solder paste printed to the printed circuit board; and thereby setting the plate-separation position so that a height of a hornlike projection of the solder paste in the measured sectional shape is at a minimum relative to a thickness of the film of the solder paste.

According to a sixth aspect of the present invention, there is provided an apparatus for printing a solder paste to a printed circuit board with the use of a screen mask plate and a squeegee, the apparatus comprising:

a moving device for moving one of the printed circuit board and the screen mask plate in a direction to be separated from the other of them after printing of the solder paste at a first moving speed and a second moving speed faster than the first moving speed;

a controller for controlling the moving device so as to move the one of the printed circuit board and the screen mask plate at the first moving speed in the direction to be separated from the other of them after printing of the solder paste and until the one of the printed circuit board and the screen mask plate reaches a plate-separation position which is a position immediately before the screen mask plate and the printed circuit board are completely separated from each other, and so as to change the first moving speed to the second moving speed when the one of the printed circuit board and the screen mask plate reaches the plate-separation position;

a device for detecting a printed state of the solder paste on the printed circuit board; and a means for setting the plate-separation position based on a result detected by the detecting device.

According to a seventh aspect of the present invention, there is provided the solder paste printing apparatus according to the sixth aspect, wherein the detecting device is a distance sensor arranged at a position a predetermined distance away from a free surface of a mask of the screen mask plate, and the setting means detects a vibration waveform of the mask of the screen mask plate based on a detection signal of the distance sensor and sets the plate-separation position based on a maximum amplitude and a vibration time of the vibration waveform.

According to an eighth aspect of the present invention, there is provided the solder paste printing apparatus according to the seventh aspect, wherein the distance sensor detects the vibration waveform of the mask of the screen mask plate generated after the screen mask plate and the printed circuit board are separated from each other after the printing of the solder paste, and the setting means sets the plate-separation position so that the maximum amplitude of the waveform based on a position of the free surface of the mask of the screen mask plate and the vibration time of the waveform from the maximum amplitude to when the mask settles in the position of the free surface are minimum.

According to a ninth aspect of the present invention, there is provided the solder paste printing apparatus according to the sixth aspect, wherein the detecting device includes a detecting sensor for measuring a sectional shape of a printed film of the solder paste to the printed circuit board, and a means for detecting a height of a hornlike projection of the solder paste from the measured sectional shape of the printed film of the solder paste by the detecting sensor, and the setting means sets the plate-separation position based on a result detected by the detecting device.

According to a tenth aspect of the present invention, there is provided the solder paste printing apparatus according to the ninth aspect, wherein the setting means sets the plate-separation position so that the height of the hornlike projection of the solder paste is at a minimum relative to a thickness of the film of the solder paste.

According to an eleventh aspect of the present invention, there is provided the solder paste printing apparatus according to the sixth aspect, wherein the moving device is a device for moving the printed circuit board to the screen mask plate.

According to a twelfth aspect of the present invention, there is provided the solder paste printing apparatus according to the sixth aspect, wherein the moving device is a device for moving the screen mask plate to the printed circuit board.

According to a thirteenth aspect of the present invention, there is provided the solder paste printing apparatus according to the sixth aspect, wherein the setting means sets the plate-separation position where the first moving speed is changed to the second moving speed so that a brittle fracture is impressed to the solder paste present between the printed circuit board and the screen mask plate.

According to a fourteenth aspect of the present invention, there is provided the solder paste printing apparatus according to the sixth aspect, wherein in the moving device, the second moving speed is a hundredfold faster than the first moving speed or more.

According to the solder paste printing method of the present invention, when the printed circuit board or the screen mask plate reaches the plate-separation position immediately before the screen mask plate and the printed circuit board are separated from each other, the moving speed of the printed circuit board or the screen mask plate is switched from low to high, thereby causing a brittle fracture to the solder paste between the screen mask plate and the printed circuit board. Accordingly, the solder paste can be prevented from adhering to a rear surface of the screen mask plate, spreading at a next printing time, generating a bridge or being insufficiently supplied. While it is necessary to decelerate a plate-separation speed so as to make a stress when the solder paste is slipped off and removed from openings of the mask of the screen mask plate smaller than an adhesion force between the printed circuit board and solder paste, the solder paste spreading between the screen mask plate and the printed circuit board would be given a ductile fracture if the plate were separated at the lower speed, which consequently causes a part of the failure solder paste to form a hornlike projection and the other part to adhere to the rear surface of the screen mask plate. This hornlike projection resulting from the ductile fracture can be prevented through the brittle fracture by increasing the plate-separation speed immediately before the plate is separated.

When the vibration waveform of the mask of the screen mask plate generated when the screen mask plate and the printed circuit board are separated from each other after printing of the solder paste is detected, the amplitude and the vibration time are increased when the plate-separation speed is switched from a low speed to a high speed at a position where the solder paste remains enough at the openings of the mask of the screen mask plate. The amplitude shows a great undulation when the plate-separation speed is kept low until the completion of the separation. Therefore, if the plate-separation position is set so that the maximum amplitude and the vibration time of the vibration waveform become minimum, the formation of the hornlike projection of the solder paste can be prevented.

Alternatively, if a sectional shape of the film of the solder paste printed to the printed circuit board is directly measured and then the plate-separation position is set so that a height of the hornlike projection is at a minimum in relation to a film thickness of the printed solder paste, the hornlike projection of the solder paste can be prevented as well.

According to the printing apparatus of the present invention, the vibration waveform of the screen mask plate is detected, or the height of the hornlike projection to the thickness of the applied film of the solder paste is detected, whereby the optimum plate-separation position can be set, and accordingly a good printing shape of the solder paste can be attained in the above-described method.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

A solder paste printing apparatus and method according to one preferred embodiment of the present invention will be described with reference to FIGS. 1–4.

Figure 1:
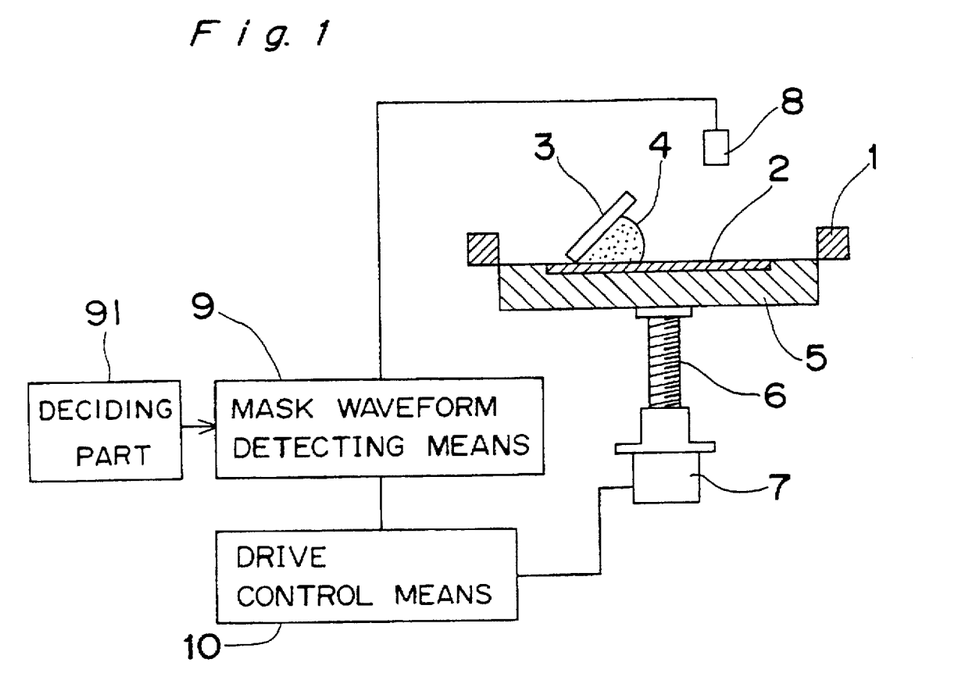
FIG. 1 is a schematic structural diagram of a solder paste printing apparatus according to one embodiment of the present invention.

In FIG. 1, reference numeral 1 is a screen mask plate, similarly, 2 a printed circuit board, 3 a squeegee, 4 a solder paste, 5 a stage supporting the printed circuit board 2 in a movable fashion in an up-and-down direction, 6 an up/down moving .mechanism for the stage 5 which is constructed of a ball screw and a nut as one example, and 7 a driving means for the up/down moving mechanism 6 which is constructed of a motor for reversibly rotating the nut. A distance sensor 8 is spaced a suitable distance above the screen mask plate 1. A vibration waveform of the mask of the screen mask plate 1 is detected by a mask waveform detecting means 9 from a shifting amount of the mask of the screen mask plate 1 detected by the distance sensor 8. A drive control means 10, to which the detection result is input, controls the drive of the driving means 7.

Figure 2:
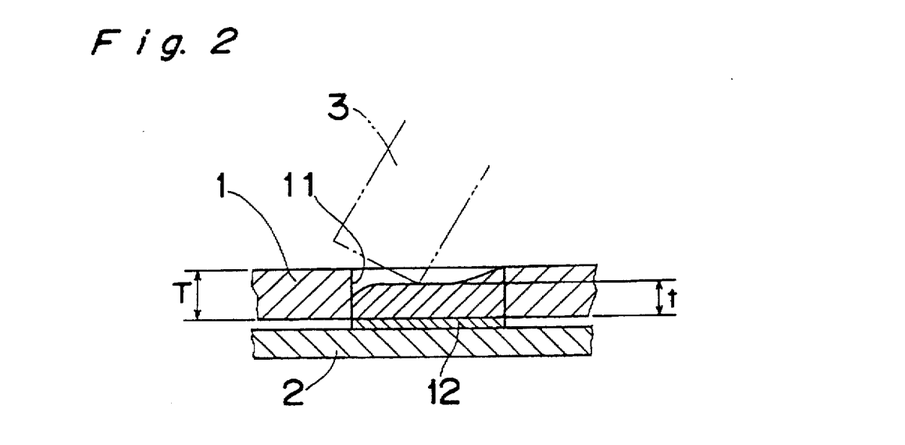
FIG. 2 is a sectional view showing a state where a solder paste is filled into a mask opening in the embodiment of FIG. 1.

The operation of the solder paste printing apparatus constructed as above will be depicted. The printed circuit board 2 is raised by the stage 5 and then contacts the screen mask plate 1. Then, the solder paste 4 is supplied onto the screen mask plate 1, which is then filled into openings 11 (referred to as "mask openings" hereinbelow) formed in the mask of the screen mask plate 1 while being scraped off by the squeegee 3. For example, when the squeegee 3 used is formed of a soft elastic body which is easy to deform, e.g., urethane rubber or the like, the solder paste 4 is scraped because the squeegee 3 is elastically restored inside the mask openings 11, as shown in FIG. 2. As a consequence, a printing thickness t of the solder paste 4, that is, an average thickness t of the printed solder paste 4 becomes smaller than a thickness T of the screen mask plate 1 by the scraped amount. Reference numeral 12 in FIG. 2 is a land of copper foil of the printed circuit board 2.

Figure 3A:
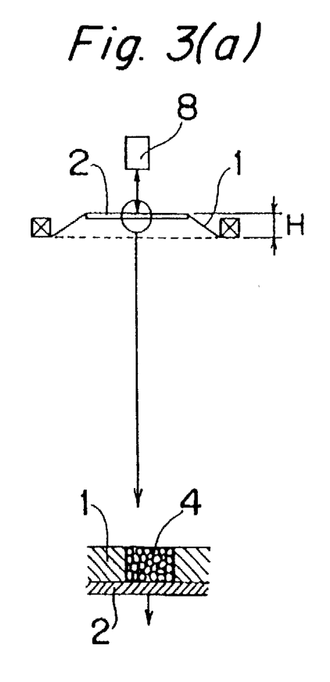
FIGS. 3(a)–3(e) are diagrams explanatory of a process where a screen mask plate and a printed circuit board are separated from each other in the embodiment.
Figure 3B:
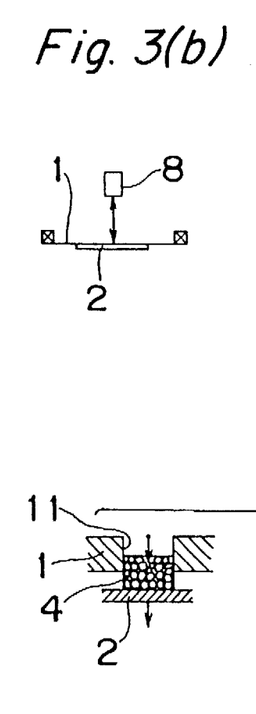
Figure 3C:
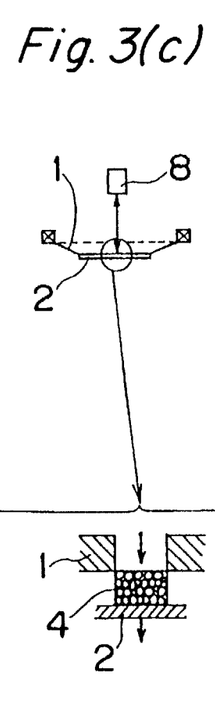
Figure 3D:
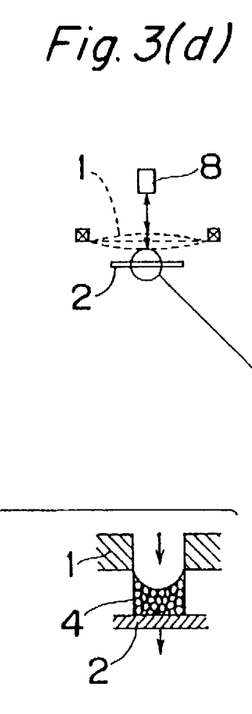
Figure 3E:
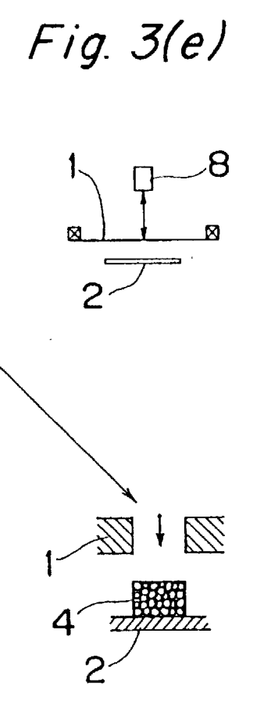

When the solder paste 4 is completely filled, a process to separate the printed circuit board 2 held in contact with the screen mask plate 1 from the screen mask plate 1 is started. FIGS. 3(a)–3(e) illustrate the behavior of the screen mask plate 1 and the state of the solder paste 4 filled in the mask openings 11 at the moment. That is, the printed circuit board 2 is lowered at a predetermined speed from a state of FIG. 3(a) wherein the solder paste 4 is completely filled into the mask openings 11, through a state of FIG. 3(b) wherein the mask of the screen mask plate 1 becomes free and flat, that is, the surface of the mask becomes a free surface, to a state of FIG. 3(c) where the screen mask plate 1 is separated from the circuit board 2. In the process from FIG. 3(b) to FIG. 3(c), the solder paste 4 filled in the mask openings 11 gradually slips out and is removed from the mask openings 11 while being in tight contact with the printed circuit board 2. When the plate 1 is perfectly separated from the board 2, the mask of the screen mask plate 1 vibrates by its elasticity and restitutive force as indicated in FIG. 3(d) and subsequently the mask of the screen mask plate 1 sits within its free surface as in FIG. 3(e). At this time, the printed circuit board 2 is further lowered to its transfer position. A shape of the solder paste 4 to be transferred to the printed circuit board 2 is determined by controlling a descending speed of the printed circuit board 2 in the separation process of the screen mask plate 1, particularly, in the process from FIG. 3(b) to FIG. 3(c).

More particularly, in order for the solder paste 4 filled in the mask openings 11 to be transferred onto the printed circuit board 2, an adhesion force between the solder paste 4 and the printed circuit board 2 should be larger than a force required for slipping the solder paste 4 off the wall surfaces of the mask openings 11. For instance, in the case where the solder paste 4 is composed of a viscous fluid having thixotropic properties, a large slip stress is generated when the solder paste 4 is slipped and removed from the wall surfaces of the mask openings 11 at a high speed, and therefore the solder paste 1 is undesirably left inside the mask openings 11 if the adhesion force of the solder paste 4 and the printed circuit board 2 is smaller than the slip stress at this time. Experiments show that the plate-separation speed to separate the printed circuit board 2 from the screen mask plate 1 with a thickness of 150 μm is suitable to be approximately 0.1 mm/s. The suitable value varies depending on the viscous characteristic of the solder paste 4.

Meanwhile, the printing shape of the solder paste 4 transferred on the printed circuit board 2 is not good if the screen mask plate 1 and the printed circuit board 2 are completely separated from each other at the slow plate-separation speed referred to above (for example, about 0.1 mm/s). This is because a ductile fracture is caused on the solder paste 4 between the screen mask plate 1 and the printed circuit board 2 at the plate-separation time thereby to cause hornlike projections 14 shown in FIG. 5. A part of the ductile-fractured solder paste 4 appears as the hornlike projection in the printing sectional shape, while some of the other is adhered to the rear surface of the screen mask plate 1. The solder paste adhered to the rear surface invites spreading of the solder paste at a subsequent printing time. For removing the disadvantage, the solder paste 4 between the screen mask plate 1 and the printed circuit board 2 is desired to be accompanied with a brittle fracture at the plate-separation time. Therefore, the screen mask plate 1 and the printed circuit board 2 should not be separated completely at the low plate-separation speed, rather the solder paste 4 should be separated from the mask openings 11 at a suitable position at a higher plate-separation speed at once. The higher plate-separation speed is enough to be about 20 mm/s according to experiments. When the moving speed of the printed circuit board, that is, the plate-separation speed is switched from low to high, in order to surely cause a brittle fracture of the solder paste, the speed is preferably switched to a higher speed of 100 times or more. For example, the plate-separation speed is switched from a lower speed of about 0.1 mm/s to a higher speed of about 20 mm/s, preferably.

Figure 4:
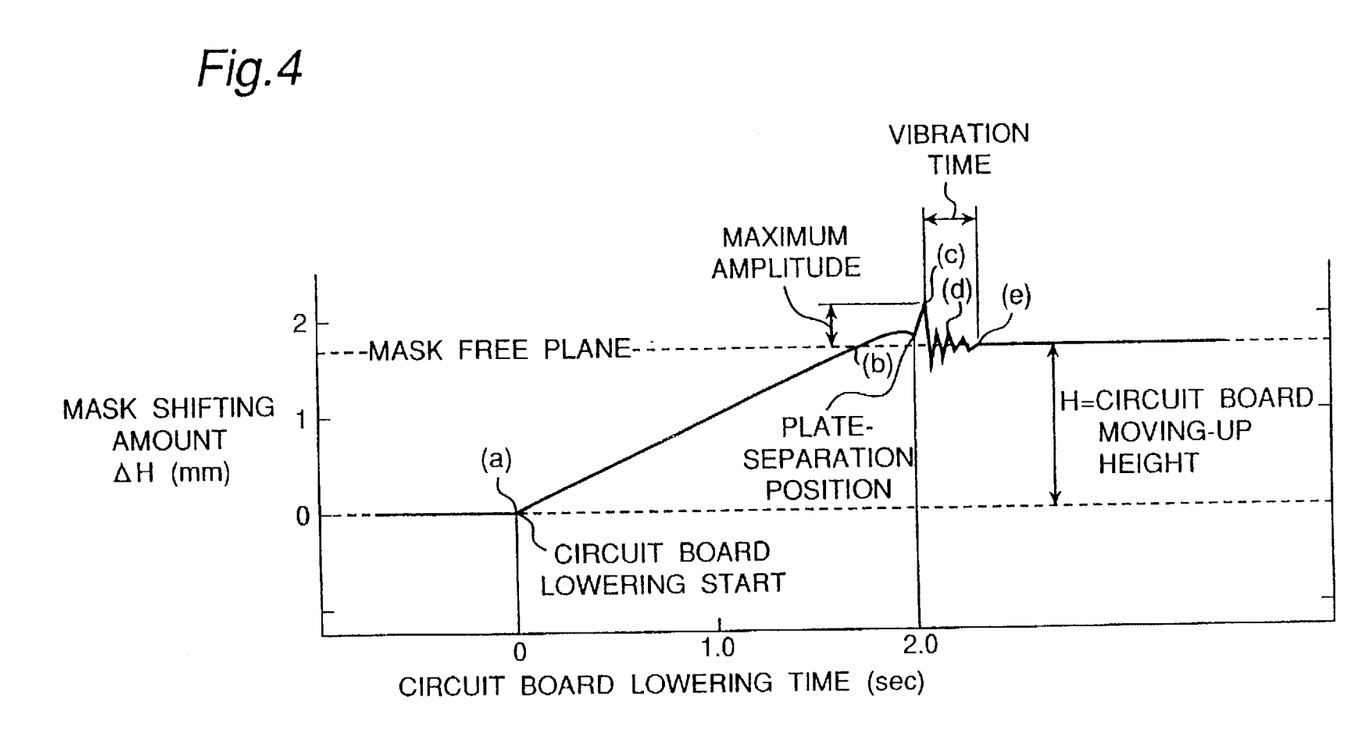
FIG. 4 is a diagram explanatory of the behavior of the screen mask plate when separated from the printed circuit board in the embodiment.

The suitable position where the plate-separation speed is increased (referred to as the "plate-separation position" in the specification, claims, and drawings) will be obtained in a manner as described below with reference to FIG. 4. FIG. 4 is a diagram showing the behavior of the mask of the screen mask plate 1 at the plate-separation time. Its abscissa axis shows the circuit board lowering time and its ordinate axis shows the mask shifting amount ΔH to the free surface of the central portion of the mask. The points (a)–(e) of FIG. 4 indicate the points of the corresponding states of FIGS. 3(a)–3(e). The portion where the vibration is measured is preferably the central portion of the mask but it is not limited to the central portion.

In the process from (b) to (c) of FIG. 4, if the plate-separation speed is switched from low to high at a position where the solder paste 4 is still fully left in the mask openings 11, the amplitude and the vibration time are large. As the switching position is gradually delayed, that is, the plate-descending time to the switching position is gradually increased, the amplitude and the vibration time become smaller. When the plate-separation is carried out further at the low speed before the solder paste 4 is completely removed from the mask openings 11, the amplitude represents a great undulation and the vibration time is increased.

Figure 10:
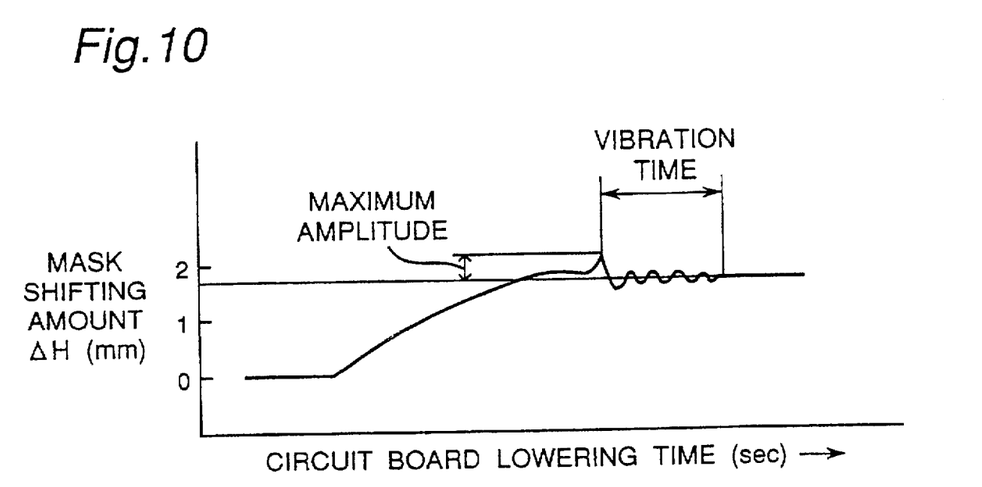
FIG. 10 is a diagram explanatory of the behavior of the screen mask plate at the plate-separation time when the plate-separation position is different from FIG. 4.
Figure 11:
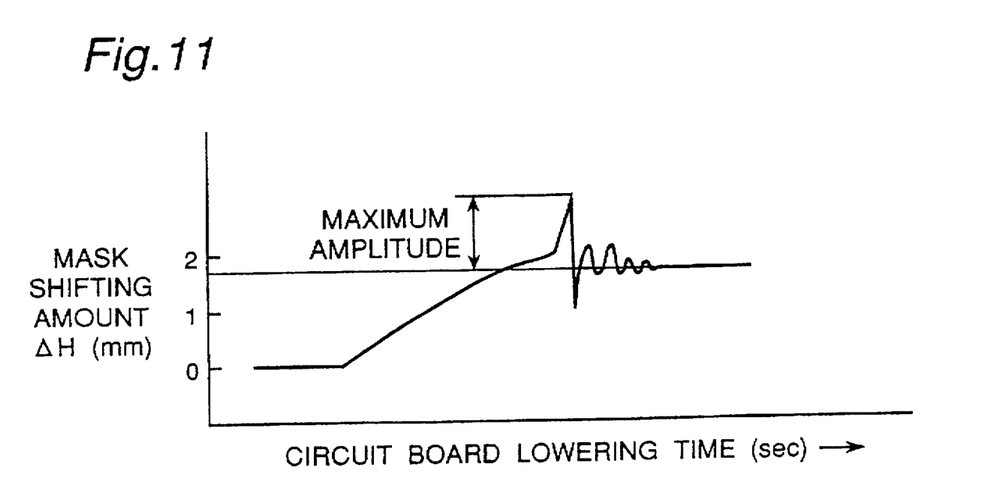
FIG. 11 is a diagram explanatory of the behavior of the screen mask plate at the plate-separation time when the plate-separation position is different from FIG. 4.

For example, specifically as shown in FIG. 10, when the plate-separation is continued at a lower speed of 0.1 mm/s as one example even after passing through the optimum plate-separation position, the maximum amplitude width becomes small but the vibration time becomes longer. On the other hand, as shown in FIG. 11, when the plate-separation is performed while being switched from a lower speed of 0.1 mm/s as one example to a higher speed of 20 mm/s as one example until reaching the optimum plate-separation position, the vibration time becomes smaller but maximum amplitude width becomes larger.

Therefore, in order to reduce the formation of the hornlike projection 14 of the solder paste 4 by decreasing the maximum amplitude width as well as the vibration time, the relative plate-separation speed between the screen mask plate 1 and the printed circuit board 2 is required to switch from low to high at the optimum plate-separation position between (b) and (c) as shown in FIG. 4, in other words, at the plate-separation position just before the screen mask plate 1 and the printed circuit board 2 are completely separated from each other after the printing of the solder paste 4. The plate-separation position is located between the point (b) intersecting the amplitude of the waveform and the free surface of the mask with each other and the portion (c) of the maximum amplitude of the waveform, and is preferably a portion where the maximum amplitude width of the waveform is starting to rise as one example. As compared with this example, in the conventional method disclosed in Japanese Laid-open Patent Publication No. 5-286113, the time when the deflection of the mask is switched from the downward deflection shift to the upward deflection shift of the printing mask means a time when the point (c) is passed and then, because the point (c) where the plate-separation is completed is passed, the above-described issues are caused. In the embodiment of the present invention, when the moving speed is switched at the plate-separation position, specifically as shown in FIG. 4, an arbitrary moving speed, for example, 0.1 mm/s or 20 mm/s is applicable in a range from (a) to (b), a lower moving speed of 0.1 mm/s is applicable in a range from (b) to the plate-separation position, and the moving speed of 20 mm/s is preferable in a range after the plate-separation position.

As such, in the present embodiment, while the switching position for switching the plate-separation speed from low to high is varied, the consequent shifting amount of the mask of the screen mask plate 1 is detected by the distance sensor 8, and also the vibration waveform of the mask of the screen mask plate 1 after the plate-separation is detected by the mask waveform detecting means 9, whereby a relation of the speed switching position, the amplitude, and the vibration time when the screen mask plate 1 is separated from the circuit board 2 is obtained. A position where the amplitude and the vibration time become minimum is hence set as the plate-separation position. In this case, the same operation and effect can be obtained by changing the moving speed instead of the plate-separation position.

In the above-described manner, since the plate-separation speed is switched from low to high by the drive control means 10 at the thus-set plate-separation position, the solder paste 4 between the screen mask plate 1 and the printed circuit board 2 can be let to undergo a brittle fracture immediately before the screen mask plate 1 is separated from the circuit board 2, so that the solder paste 4 can be prevented from adhering to the rear surface of the screen mask plate 1. Accordingly, it can be prevented that the solder paste 4 spreads at the next printing time, generates a bridge, or is supplied insufficiently, and a good printing shape can be obtained.

In the embodiment, although the mask waveform detecting means 9 detects the mask waveform and sets the plate-separation position, the detection of the mask waveform can be performed by one means and the setting of the plate-separation position can be performed by a different means.

In the embodiment, as shown in FIG. 1, a deciding part 91 can be further provided for deciding whether or not the printing state of the solder paste is acceptable. When the deciding part 91 decides that the printing state of the solder paste 4 is out of the acceptable range, the plate-separation position set by the mask waveform detecting means 9 may be changed. The acceptable range is preferably a range for not causing a bridge state erroneously connecting adjacent solder paste portions with each other which is caused by poor printing of the solder paste between the adjacent solder paste portions, and may be promptly changed by observing the printing state after the acceptable range is previously set through experience, preferably.

Figure 5:
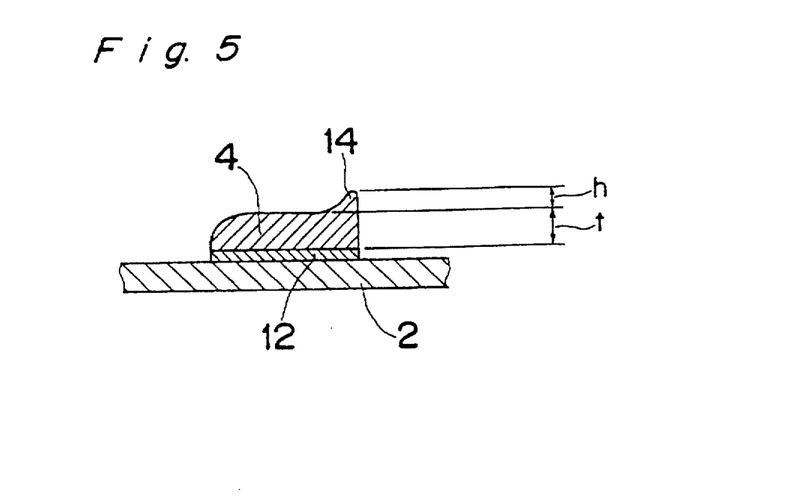
FIG. 5 is a diagram explanatory of a printing sectional shape of the solder paste after printing.
Figure 6:
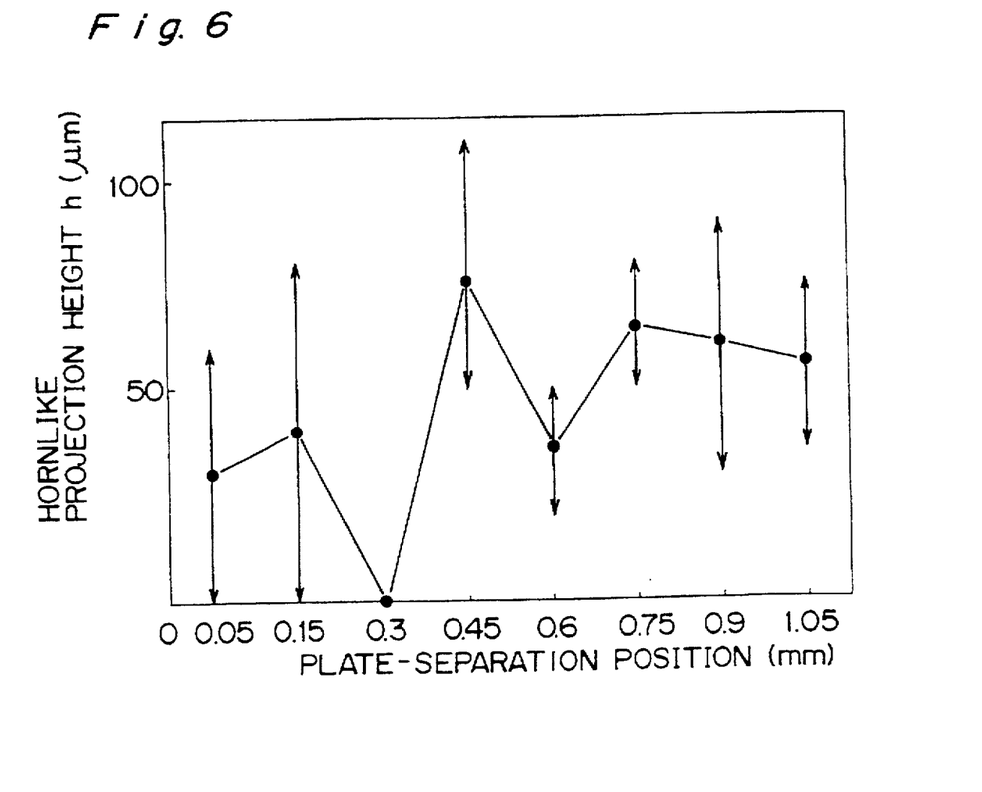
FIG. 6 is a graph indicating a relation between a position where the screen mask plate is separated from a circuit board and a height of a hornlike projection in a different embodiment of the present invention.

The foregoing embodiment exemplifies the method whereby the plate-separation position is obtained by detecting the vibration waveform of the screen mask plate 1. However, the present invention is not limited to the embodiment. In the case, for example, where the plate-separation position is not proper, the hornlike projection 14 is generated in the printing sectional shape of the solder paste after printing, as shown in FIG. 5. Therefore, such an arrangement as follows may be employed to obtain a good printing shape. That is, the stitching position to switch the plate-separation speed to a high speed is variously changed as indicated in FIG. 6, a height h of the hornlike projection is measured from the printing sectional shape of the solder plate at the time and, a position where the height h becomes smallest is set as the plate-separation position. The plate-separation position in FIG. 6 is shown by the distance from the free surface of the mask.

Figure 9:
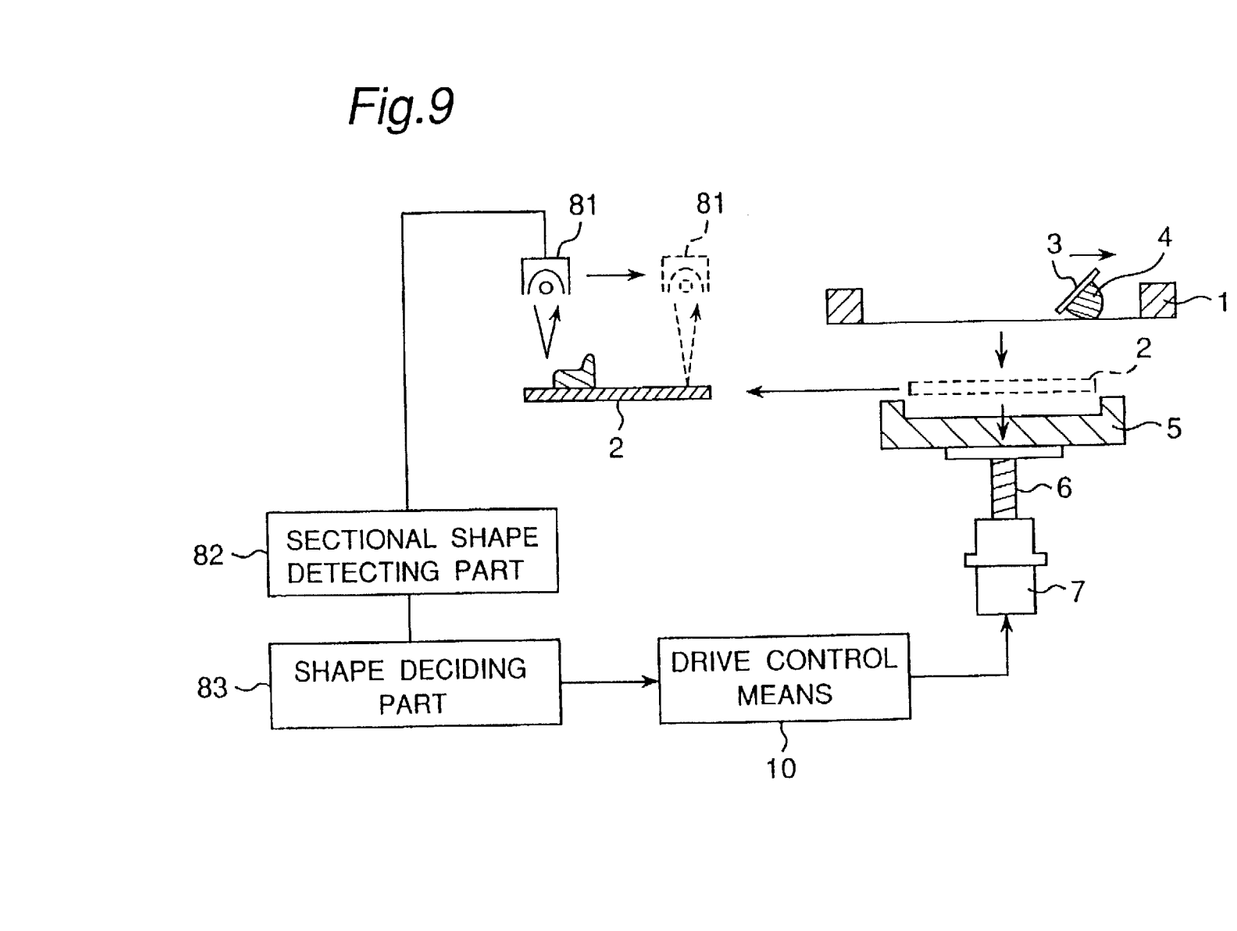
FIG. 9 is a schematic structural diagram of a solder paste printing apparatus according to another embodiment of the present invention.

FIG. 9 shows a method for detecting the hornlike projection 14 in the embodiment. After the printing of the solder paste, the printed circuit board 2 is taken out from the stage 5 to locate it at a hornlike projection measuring position shown by a solid line, and then a laser light is emitted from the laser emitting and receiving device 81 toward the printed circuit board 2. The laser reflected by the printed circuit board 2 is received by the laser emitting and receiving device 81 to measure the sectional shape of the solder paste on the surface of the printed circuit board 2. The emission of the laser light from the laser emitting and receiving device 81 to the printed circuit board 2 is preferably performed along the direction of moving of the stage 3. The laser light is emitted so that at least one of the sectional shape of the solder paste portion is taken with respect to each solder paste portion on the printed circuit board 2. The measured data is scored in a sectional shape detecting part 82 and then, when a shape deciding part 83 decides that the height of the hornlike projection in the solder paste portion stored in the sectional shape detecting part 82 is not less than an acceptable height, the setting position of the plate-separation position is changed and then, the drive control means 10 controls the drive of the driving means 7 so that the lowering speed of the stage 5 is switched from low to high at the changed plate-separation position. In the embodiment, although the shape deciding part 83 detects the sectional shape and sets the plate-separation position, the detection of the sectional shape can be performed by one means and the set of the plate-separation position can be performed by a different means. The acceptable height is preferably a height for not causing a bridge state erroneously connecting adjacent solder paste portions with each other which is caused by poor printing of the solder paste between the adjacent solder paste portions, and may be promptly changed by observing the printing state after the acceptable height is previously set through experience, preferably.

When the sectional shape of the hornlike projection is measured and then the plate-separation position is set in the above manner, the plate-separation position may be set without detecting the waveform of FIG. 1 but, in order to perform the drive control with high accuracy, the plate-separation position set by measuring the sectional shape of the hornlike projection and the plate-separation position set by detecting waveform of FIG. 1 are respectively set and the resulting plate-separation position may be set at a middle position between the two kinds of the plate-separation positions. When there are a plurality of hornlike projections, each plate-separation position for each hornlike projection is calculated and then the plate-separation position can be set by calculating an average of the calculated plate-separation positions.

Figure 12:
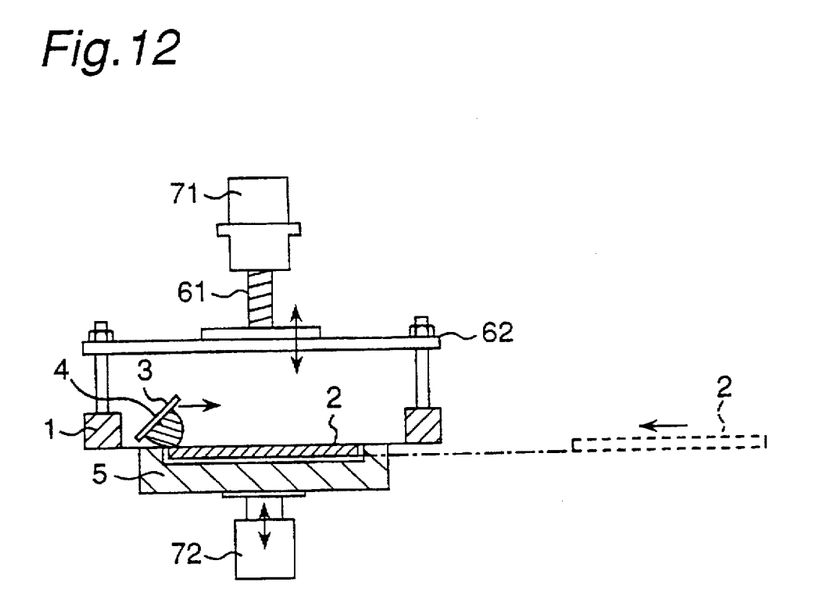
FIG. 12 is a schematic structural diagram of a solder paste printing apparatus according to a still further embodiment of the present invention.

In the embodiment, as a method of separating the printed circuit board 2 from the screen mask plate 1 after the printing of the solder paste, the stage 5 supporting the printed circuit board 2 is driven by the driving means 7 without moving the screen mask plate 1. However, the present invention is not limited to this method, for example, as shown in FIG. 12, the screen mask plate 1 may be separated from the printed circuit board 2 by the driving means 71. In this embodiment of FIG. 12, the screen mask plate 1 is connected to a ball screw 61 as one example of a upward and downward moving mechanism by a bracket 62. The ball screw 61 is rotated by a motor 71 as one example of a driving means. The stage 5 supporting the printed circuit board 2 is lowered from its printing position by a stage up-and-down cylinder 72 when the printed circuit board 2 is transferred on the stage 5 and when the printed circuit board 2 is transferred from the stage 5. Therefore, similar to the previous embodiment, after the printing of the solder paste, the screen mask plate 1 is moved upwardly at a lower speed to the printed circuit board 2 by the motor 71. When the screen mask plate 1 and the printed circuit board 2 reach the plate-separation position, the upward moving speed of the screen mask plate 1 is switched from low to high by the motor 71 to obtain the same operation and effect described above.

According to the solder paste printing method of the present invention, as is clear from the above description, the moving speed of the printed circuit board or the screen mask plate is switched from low to high when the printed circuit board or the screen mask plate reaches the plate-separation position immediately before the screen mask plate and the circuit board are separated from each other. Therefore, the solder paste between the screen mask plate and the printed circuit board experiences a brittle fracture immediately before the screen mask plate and the printed circuit board are separated from each other. The solder paste can be accordingly prevented from adhering to the rear surface of the screen mask plate. Because spreading of the solder paste at the next printing time, the generation of a bridge, or insufficient supply of the solder paste can be prevented, a good printing state of the solder paste can be achieved.

Moreover, the plate-separation position is set, by detecting the vibration waveform of the screen mask plate formed when the screen mask plate and the printed circuit board are separated from each other after printing of the solder paste, so that the maximum amplitude and the vibration time of the vibration waveform become minimum. Accordingly, a suitable condition can be set for the separation of the plate, and a good printing state of the solder paste can be realized.

Alternatively, the plate-separation position is set by directly measuring the shape of the applied film of the solder paste printed onto the printed circuit board so that the height of the hornlike projection to the thickness of the applied film is minimum. Accordingly, a suitable plate-separation condition can be set for the printing mask and a good printing state of the solder paste can be achieved.

In the solder paste printing apparatus of the present invention, the optimum plate-separation position is set by detecting the vibration waveform of the screen mask plate or detecting the height of the hornlike projection to the thickness of the printed film of the solder paste, so that a good printing shape of the solder paste can be obtained according to the above method.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for printing solder paste to a printed circuit board with use of a screen mask plate and a squeegee, the screen mask plate comprising a mask having a free surface, the apparatus comprising:

a moving device for moving one of the printed circuit board and the screen mask plate in a direction to be separated from the other of them after printing of the solder paste at a first moving speed and a second moving speed faster than the first moving speed;

a control means for controlling the moving device so as to move the one of the printed circuit board and the screen mask plate at the first moving speed in the direction to be separated from the other of them after printing of the solder paste and until We one of the printed circuit board and the screen mask plate reaches a plate-separation position which is a position immediately before the screen mask plate and the printed circuit board are completely separated from each other, and so as to change the first moving speed to the second moving speed when the one of the printed circuit board and the screen mask plate reaches the plate-separation position;

a device for detecting a printed state of the solder paste on the printed circuit board; and a means for setting the plate-separation position based on a result detected by the detecting device.

2. The solder paste printing apparatus according to claim 1, wherein the detecting device is a distance sensor arranged at a position a predetermined distance away from the free surface of the mask of the screen mask plate when the screen mask plate is positioned in the apparatus and contacts the printed circuit board, and the setting means detects a vibration waveform of the mask of the screen mask plate based on a detection signal of the distance sensor and sets the plate-separation position based on a maximum amplitude and a vibration time of the vibration waveform.

3. The solder paste printing apparatus according to claim 2, wherein the setting means detects the vibration waveform of the mask of the screen mask plate generated after the screen mask plate and the printed circuit board are separated from each other after the printing of the solder paste, and the setting means sets the plate-separation position so that the maximum amplitude of the waveform based on a position of the free surface of the mask of the screen mask plate and the vibration time of the waveform from the maximum amplitude to when the mask settles in the position of the free surface are minimum.

4. The solder paste printing apparatus according to claim 3, wherein the setting means sets the plate-separation position where the first moving speed is changed to the second moving speed so that a brittle fracture is impressed to the solder paste present between the printed circuit board and the screen mask plate.

5. The solder paste printing apparatus according to claim 2, wherein the setting means sets the plate-separation position where the first moving speed is changed to the second moving speed so that a brittle fracture is impressed to the solder paste present between the printed circuit board and the screen mask plate.

6. The solder paste printing apparatus according to claim 1, wherein the detecting device includes a detecting sensor for measuring a sectional shape of a printed film of the solder paste to the printed circuit board, and a means for detecting a height of a hornlike projection of the solder paste from the measured sectional shape of the printed film of the solder paste by the detecting sensor.

7. The solder paste printing apparatus according to claim 6, wherein the setting means sets the plate-separation position so that the height of the hornlike projection of the solder paste is at a minimum relative to a thickness of the film of the solder paste.

8. The solder paste printing apparatus according to claim 6, wherein the setting means sets the plate-separation position where the first moving speed is changed to the second moving speed so that a brittle fracture is impressed to the solder paste present between the printed circuit board and the screen mask plate.

9. The solder paste printing apparatus according to claim 1, wherein the moving device is a device for moving the printed circuit board toward and away from the screen mask plate.

10. The solder paste printing apparatus according to claim 1, wherein the moving device is a device for moving the screen mask plate toward away from the printed circuit board.

11. The solder paste printing apparatus according to claim 1, wherein the setting means sets the plate-separation position where the first moving speed is changed to the second moving speed so that a brittle fracture is impressed to the solder paste present between the printed circuit board and the screen mask plate.

12. The solder paste printing apparatus according to claim 1, wherein in the moving device, the second moving speed is a hundredfold faster than the first moving speed or more.

* * * * *